United States Patent [19]

Chin

[11] 4,456,677
[45] Jun. 26, 1984

[54] COMPOSITE RESIST STRUCTURES FOR SUBMICRON PROCESSING IN ELECTRON/ION LITHOGRAPHY

[75] Inventor: Te N. Chin, Princeton, N.J.

[73] Assignee: The United Stated of America as represented by the Secretary of the Army, Washington, D.C.

[21] Appl. No.: 406,825

[22] Filed: Aug. 10, 1982

Related U.S. Application Data

[62] Division of Ser. No. 294,106, Aug. 19, 1981, abandoned.

[51] Int. Cl.³ .......................... G03C 1/78; G03C 1/96
[52] U.S. Cl. .................................... 430/276; 430/271; 430/272; 430/296; 430/326; 430/278
[58] Field of Search ............... 430/198, 269, 270, 272, 430/326, 276, 296, 278, 271

[56] References Cited

U.S. PATENT DOCUMENTS

| | | | |
|---|---|---|---|
| 3,443,944 | 5/1969 | Wise | 430/198 |
| 3,877,950 | 4/1975 | Felten | 430/198 |
| 3,884,698 | 5/1975 | Kakihama et al. | 430/272 |
| 4,008,084 | 2/1977 | Ikeda et al. | 430/276 |
| 4,061,814 | 12/1977 | Politycki | 430/296 |
| 4,132,168 | 1/1979 | Peterson | 430/296 |

Primary Examiner—Jack P. Brammer
Attorney, Agent, or Firm—Robert P. Gibson; Anthony T. Lane; Max Yarmovsky

[57] ABSTRACT

Composite resist structures are described for processing submicron electronic and optical circuits requiring very good pattern resolution between lines because of extremely close spacings between circuit elements. The present invention discloses matrix and layer structures wherein high atomic number (Z) material is used to confine the scattering of the electron beams in the resist. A low Z material is used in combination with a high Z material in the layered configuration to slow down electron velocities without creating a great number of scattered electrons.

4 Claims, 3 Drawing Figures

COMPOSITE RESIST STRUCTURES FOR SUBMICRON PROCESSING IN ELECTRON/ION LITHOGRAPHY

GOVERNMENTAL INTEREST

The invention described herein may be manufactured, used and licensed by or for the Government for governmental purposes without the payment to me of any royalty thereon.

This application is a division of application Ser. No. 294,106, filed Aug. 19, 1981, now abandoned.

FIELD OF THE INVENTION

This invention relates to means for processing submicron electronic and optical circuit structures which require extremely close spacings between elements.

BACKGROUND OF THE INVENTION

Optical lithography is still the principal method today in the manufacturing of integrated circuits with a line width down to about one micrometer. The degradation of its replicated pattern of narrower line width arises from two effects: (1) diffraction at the line edges, and (2) interference due to reflections. Recently, work on X-ray lithography indicates that these two problems are alleviated in the X-ray system. Various schemes are being investigated in several laboratories for submicron applications. It turned out that the range of the internal electrons created by the X-ray may become a limiting factor in the lithographic resolution.

One of the attractive advantages of the electron beam lithography rather than the optical and X-ray lithographies is the ability to produce a two-dimensional pattern without utilizing an intricate mask. With a resist layer of 0.5 micrometer thick, structures of submicron linewidth have already been produced in the electron beam system. In the technology of fine-line electron beam lithography, space charge and electron scatterings have been the fundamental factors that limit line resolution. Improvement in pattern resolution of microfabrications on silicon substrates has been prevented by electron scattering and back scattering.

Study of energy dissipation in thin polymer films under electron beam bombardment has shown that even with an electron beam of negligible diameter which is incident upon a resist surface, the profile diameter that will be developed is dominantly determined by multiple electron scattering as illustrated in FIG. 1. It is well known in the art that a 10 KeV electron beam, having a width of about 1.1 micrometer, will have an electron range of about 2.1 micrometers. Although the proportion of beam width to electron range changes with different materials, an increase in range will generally produce an increase in beam width and conversely a decrease in electron range will mean a decrease in beam width. However, it is well known in the prior art that it is very difficult to produce very small electron beam diameters with low values of voltage and that moderate values are required to effectively break the atomic bonding of a resist layer.

SUMMARY OF THE INVENTION

The present invention describes composite resist structures suitable for use in submicron processing in electron/ion lithography. The composite resist structure comprises a high atomic number (Z) material uniformly dispersed in a highly sensitive polymer electron resist which is then deposited on a substrate.

A further modification includes a tri-layered thin film disposed on a substrate wherein a first layer is made of a low Z material such as aluminum, a second layer of high Z material such as gold operatively disposed intermediate the first layer and thrid positive resist layer. The first layer thickness is limited to a "diffusion depth" having negligible electron scattering angle. The first layer slows the electrons down to an average energy level E, so that when they enter the second layer they will behave as an isotropic source therein. The second layer thickness is reduced from a Bethe range by a small fraction to enable only a small fraction of the beam current to enter the electron resist.

An object of the present invention is to provide an improved composite resist structure for submicron processing in electron/ion lithography.

Another object of the present invention is to provide a tri-layered thin film for use in electron/ion lithography which has improved pattern resolution.

A further object of the present invention is to provide an improved composite resist structure with moderate electrical conductivity for submicron processing in electron/ion lithography which reduces space charge and electron back scattering and improves pattern resolution.

For a better understanding of the present invention, together with other and further objects thereof, reference is made to the following descriptions. taken in connection with the accompanying drawings.

DETAILED DESCRIPTION OF THE PREFERRED EMBODIMENT

Figure 2:
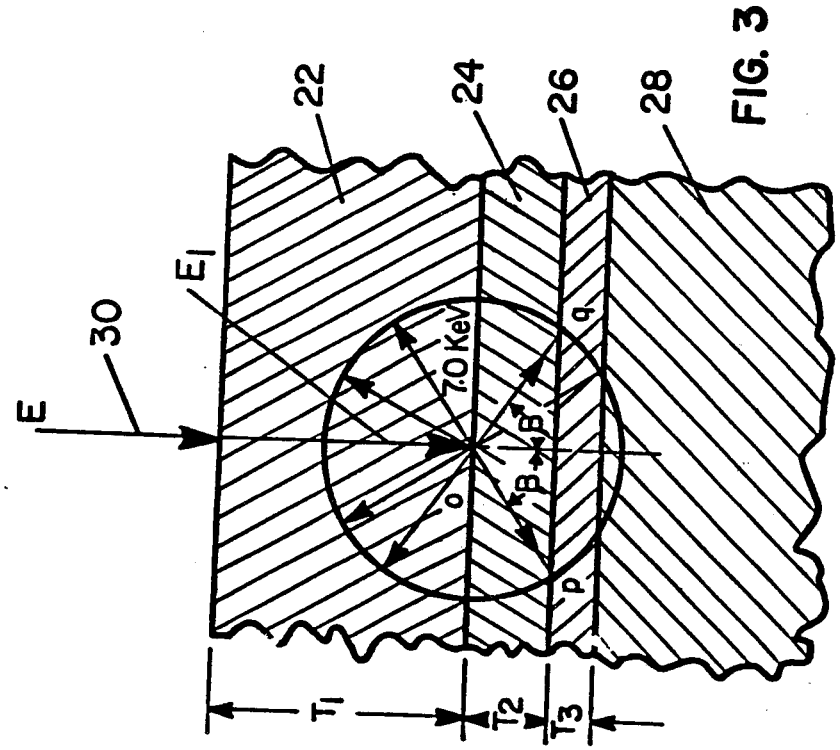
FIG. 2 is a schematic cross-sectional view of a composite resist matrix structure.

Referring now to FIG. 2, a resist polymer material 10, such as polymethyl methacrylate, hereinafter referred to as PMMA, has a high Z material 12, such as gold uniformly dispersed therein. The composite resist material is then deposited on a silicon substrate 14. The composite resist layer 16, for a 10 KeV electron beam 18, may have a film thickness of approximately 400 Å for a composite resists layer comprising 80% gold particles having a diameter less than 10 Å in a 20% polymer resist PMMA or polymeth acrylonitrile (PMCN).

Based upon the expressions for the Bethe range R, where D. Liljequist in the J. Phys. D10 1363 (1977) showed that the range $$R = 9.14\,(10)^{-4} \frac{A E_o^2}{\rho Z \ln(.108 E_o/Z_s^{\frac{2}{3}})}$$

where
- $E_o$ = initial energy of the electron beam
- A = atomic weight in grams
- $\rho$ = density of the solid in gm cm$^{-3}$
- E = average energy of the electrons in eV  Z = Atomic number and it is evident that the range R of an electron beam in "high Z" materials is much smaller than in "low Z"

materials. It is also noted that the value of the Bethe range decreases with the increase of the atomic number Z of the solid, with an exponent usually between 1 and 2. In the present invention, the average Z is 3.6 for polymer PMMA, and 79 for gold. This indicates that the isodose contours, shown in FIG. 2 as dashed lines 20, will be reduced in size by a factor of 22 or more. The introduction of the high Z material 12 in the resist material 10 will confine the extent of the electron scatterings and also absorb a substantial portion of the electron energy, consequently it is necessary to use a highly sensitive electron resist material such as PMMA or PMCN.

Figure 3:
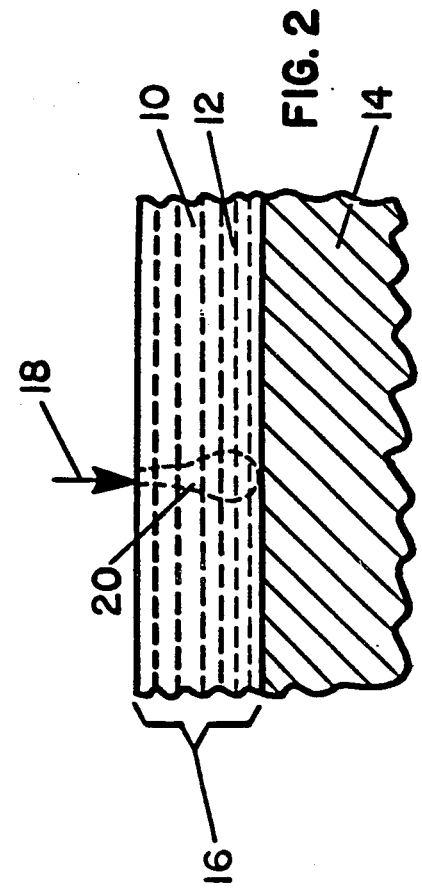
FIG. 3 is a schematic cross-sectional view of a composite resist layer structure.
Figure 1:
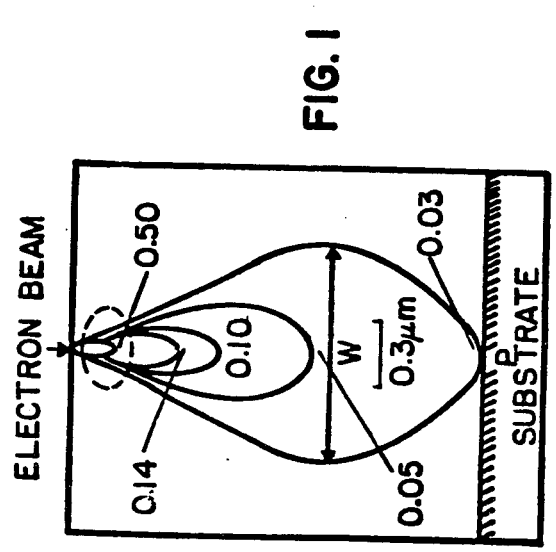
FIG. 1 is a Monte Carlo Calculation of Isodose contours for a 10 KeV beam.

Referring now to FIG. 3, a layer structure comprises three thin films 22, 24 and 26 disposed on top of a substrate 28. Layer 22 is a low Z material such as aluminum, layer 24 is a high Z material such as gold and layer 26 is a positive resist. A homogeneous electron beam having an average energy E is shown by arrow 30 incident upon the top of layer 22. The thickness $T_1$, of approximately 5860 Å corresponds to the "diffusion depth" D, where the electrons are considered to slow down to an average energy E of 7.0 KeV, with negligible divergent angle. As the electrons enter layer 24, they abruptly undergo multiple scatterings and behave as an isotropic source in the gold layer 24. If the thickness of the thin film gold layer is greater than the range of these electrons in high Z material 24, only an insignificant amount of electrons will pass on to the resist layer 26 and cause scissions in the polymer resist layer 26.

In operation, in order to expose the polymer resist layer 26 to electron irradiation, the thickness of $T_2$ has to be reduced from the aforementioned Bethe range by a small fraction. Under an electron beam of 10 KeV, an example of the calculations is shown in FIG. 3. In this instance, if the thickness $T_2$ is reduced to approximately 650 Å, from the Bethe range of 710 Å, the angle $\beta$, which defines the maximum angle of scattered electrons, is 24 degrees and the line width $\overline{pq}$, subtended by angle $2\beta$, has a limit of 580 Å approximately. The window for the electron exit, in this example, will have a solid angle ($\Omega$) where $$106 = 2\pi(1 - \cos \beta) = 0.5432$$

and a fraction of the electrons (i) where $$i = (0.5432/4\pi) = 0.0432$$

may escape, that is only 4.32 percent of the beam current is estimated to enter the electron resist layer 26.

The latter embodiment shown in FIG. 3 may also use a carbon film instead of aluminum as a low Z material. The function of the aluminum layer is to slow down the electron velocities without creating a great number of scattered electrons. The aluminum layer is suggested in this instance instead of carbon mainly because aluminum is easier than carbon to be removed in the chemical development for the lithography.

While there has been described and illustrated specific embodiments of the invention, it will be obvious that various changes, modifications and additions can be made herein without departing from the field of the invention which should be limited only by the scope of the appended claims.

What is claimed is:

1. A composite resist structure for submicron processing in electron/ion lithography which comprises:
    substrate means for holding submicron electronic and optical circuits thereon;
    first film means positioned intermediate said circuit and electron beams for slowing down incident electron beams having potentials of approximately 10 KeV, which includes an aluminum layer having a thickness of approximately 5680 Å;
    second film means positioned in contact with one side of said aluminum layer for causing said electron beam which passes through said first film means to act as an isotropic beam source in said second film means, which includes a gold layer of material having a thickness which allows only a small fraction of said isotropic beam to pass therethrough; and
    third film means disposed between said second film means and said substrate means for providing a positive resist film suitable for said submicron processing.

2. A composite resist structure as recited in claim 1 wherein said aluminum layer has a thickness limited to a diffusion depth having a negligible electron divergent angle.

3. A composite resist structure as recited in claim 2 wherein said thickness of said second film means is reduced to approximately 650 Å when the Bethe range is approximately 710 Å.

4. A composite resist structure as recited in claim 3 wherein said first film means includes a carbon film.

* * * * *